United States Patent [19]
Najm et al.

[11] Patent Number: 5,305,417
[45] Date of Patent: Apr. 19, 1994

[54] APPARATUS AND METHOD FOR DETERMINING WAFER TEMPERATURE USING PYROMETRY

[75] Inventors: Habib N. Najm; Mehrdad M. Moslehi; Somnath Banerjee; Lino A. Velo, all of Dallas, Tex.

[73] Assignee: Texas Instruments Incorporated, Dallas, Tex.

[21] Appl. No.: 37,771

[22] Filed: Mar. 26, 1993

[51] Int. Cl.$^5$ .............................................. G01J 5/06
[52] U.S. Cl. .................................... 392/418; 374/126; 118/724
[58] Field of Search ................ 392/418, 416; 118/724, 118/725, 50.1; 219/390, 405, 411; 374/9, 121, 123, 126–132; 250/492.1

[56] References Cited

U.S. PATENT DOCUMENTS

| | | | |
|---|---|---|---|
| 4,417,822 | 11/1983 | Stein et al. | 374/129 |
| 4,806,321 | 2/1989 | Nishizawa et al. | 118/725 |
| 4,956,538 | 9/1990 | Moslehi | 219/121.6 |
| 5,156,461 | 10/1992 | Moslehi et al. | 374/121 |
| 5,180,226 | 1/1993 | Moslehi | 374/129 |
| 5,188,458 | 2/1993 | Thompson et al. | 374/121 |

OTHER PUBLICATIONS

M. M. Moslehi, et al., "Sensor Fusion for ULSI Manufacturing Process Control", Semiconductor Process and Design Center, Texas Instruments (2 pages).

Primary Examiner—Bruce A. Reynolds
Assistant Examiner—John A. Jeffery
Attorney, Agent, or Firm—Jacqueline J. Garner; William E. Hiller; Richard L. Donaldson

[57] ABSTRACT

In a RTP reactor where wafer temperature is measured by a pyrometer assembly (32), a pyrometer assembly (50) is further provided to measure the temperature of the quartz window (30) that is situated between the wafer pyrometer assembly (32) and the wafer (16) that is being processed. During the calibration procedure (100, 120) where a thermocouple wafer is used, the measurements from the wafer pyrometer assembly (32) and the window pyrometer assembly (50) are calibrated, and pyrometer measurements and thermocouple measurements are collected and compiled into calibration tables. During actual RTP reactor operation, the data from the calibration tables and current wafer and window pyrometer measurements are used to compute corrected wafer temperature(s). The corrected wafer temperature(s) is/are then used to control the intensities of the heating lamps according to the wafer processing heating schedule.

23 Claims, 4 Drawing Sheets

APPARATUS AND METHOD FOR DETERMINING WAFER TEMPERATURE USING PYROMETRY

TECHNICAL FIELD OF THE INVENTION

This invention relates in general to the field of semiconductor processing. More particularly, the present invention relates to apparatus and a method for measuring and determining wafer temperature in a rapid thermal processor using pyrometry.

BACKGROUND OF THE INVENTION

In a single-wafer rapid thermal processing reactor (RTP), one of the critical process parameters is the temperature of the wafer. Infrared pyrometers have been used to measure the temperature of a wafer being processed in the rapid thermal processing reactor. The reactor typically uses several heating lamps arranged in some predetermined pattern and situated on one side of the wafer. A disc of quartz functioning as a quartz window separates the heating lamps from the wafer being processed in the reactor. The quartz window therefore maintains chamber vacuum and also transfers the radiant heat from the heating lamps to the wafer. The pyrometer is typically mounted remotely from the wafer and on the same side of the quartz window as the heating lamps. The wafer temperature detected by the pyrometer is then advantageously used to control the intensity of the heating lamps in order to increase or decrease wafer temperature depending on predetermined processing parameters or recipes.

Since the quartz window is situated between the pyrometer and the wafer, the pyrometer must, in effect, detect the radiant light emitted from the heated wafer through the window. Given the intense heat that the quartz window is subjected to, originating from both the heating lamps as well as the wafer itself, the temperature of the window may reach significant levels. The intense temperature of the quartz window may cause inaccuracies in the detected wafer temperature, which may adversely alter actual wafer processing parameters.

SUMMARY OF THE INVENTION

In accordance with the present invention, apparatus and a method for determining wafer temperature using pyrometry are provided which substantially eliminate or reduce disadvantages and problems associated with prior circuits and methods.

In one aspect of the present invention, a method for controlling a RTP reactor in processing a semiconductor wafer is provided. Assuming that the quartz window temperature can be accurately measured, the wafer pyrometer assembly is first calibrated using a thermocouple wafer and wafer calibration data, including the window temperature, are collected and compiled into a wafer pyrometer calibration table. During execution of a predetermined wafer processing heating sequence for processing the wafer, wafer pyrometer measurements and window temperature levels are obtained. From this data and the data in the wafer pyrometer calibration table, a corrected wafer temperature may be computed and provided to control the heating element of the RTP reactor accordingly.

In another aspect of the present invention, a method for controlling a RTP reactor in processing a semiconductor wafer is provided. A window pyrometer assembly is mounted in the RTP reactor adapted for measuring the window temperature and producing window pyrometer measurements. A thermocouple wafer is loaded in the RTP reactor, the thermocouple wafer being adapted for producing true wafer temperatures. The wafer pyrometer assembly is calibrated by gathering first wafer pyrometer measurements, first true wafer temperatures, and first window pyrometer measurements for a predetermined range of first true wafer temperature measurements. A wafer pyrometer calibration table is compiled which is indexable by the first wafer pyrometer measurements to access corresponding the first true wafer temperatures, and window pyrometer measurements. The window pyrometer assembly is then calibrated and second wafer pyrometer measurements, second true wafer temperatures, and second window pyrometer measurements are collected for a predetermined number of thermal cycles. These data are then compiled into a window pyrometer calibration table indexable by a window pyrometer offset to access a corresponding window temperature error factor. The window temperature error factors and window pyrometer offsets are computed from the second true wafer temperatures, second window pyrometer measurements, and data in the wafer pyrometer calibration table. During execution of the wafer processing heat schedule, wafer pyrometer measurements and window pyrometer measurements are collected. From these data and data in the wafer and window pyrometer calibration tables, a corrected wafer temperature is computed. The corrected wafer temperature is then used to control the heating element according to the wafer processing heating schedule.

In yet another aspect of the present invention, apparatus for controlling a RTP reactor is provided. The RTP reactor has at least one heating element controllably heating a wafer through a window, and a wafer pyrometer assembly is used to produce at least one wafer pyrometer measurement. A window pyrometer assembly is further mounted in the RTP reactor and measures the temperature of the window. During calibration, a wafer pyrometer calibration table and a window pyrometer calibration table are compiled. During actual wafer processing, a window temperature compensation module accesses the wafer and window pyrometer calibration tables, and receives the wafer and window pyrometer measurements during wafer processing. The window temperature compensation module then computes a corrected wafer temperature in response to the data in the tables and data being collected during wafer processing. The corrected wafer temperature is then provided to a heating element controller, which generates control signals for controlling the heating element.

BRIEF DESCRIPTION OF THE DRAWINGS

For a better understanding of the present invention, reference may be made to the accompanying drawings, in which.

DETAILED DESCRIPTION OF THE INVENTION

Figure 1:
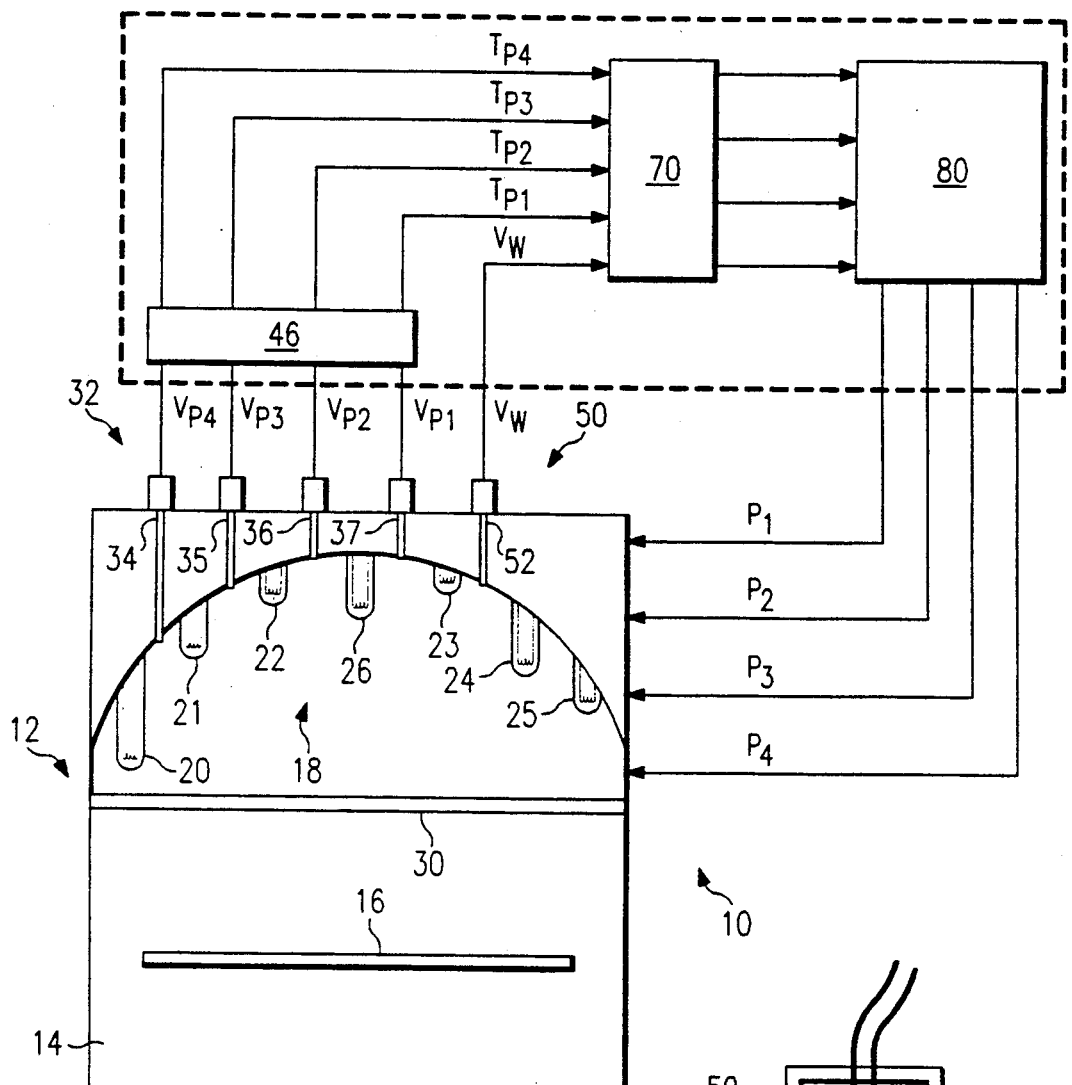
FIG. 1 is a schematic and logic diagram of a rapid thermal processor with wafer pyrometer and window pyrometer to determine wafer and window temperatures.

With reference to the drawings, FIG. 1 illustrates a schematic and logic block diagram of a preferred embodiment of apparatus and method for measuring the wafer temperature, indicated generally at 10 and constructed according to the teaching of the present invention. A single-wafer rapid thermal processing (RTP) automated vacuum processor (AVP) reactor 12 has a reaction chamber 14 where a wafer 16 for semiconductor processing, such as chemical vapor deposition, is shown. The reactor 12 has a heating system 18 consisting of several heating elements or heating lamps 20-25 arranged in a predetermined pattern over one side of the wafer 16. Preferably, the heating lamps 20-25 are arranged in three concentric circles (not shown) and a single heating lamp 36 is positioned in the center over the wafer 16 to ensure axisymmetric heating. The arrangement shown in FIG. 1 is illustrative and only shows the approximate locations of the heating lamps 20-25. The heating lamps 20-25 are arranged, according to their position, into multiple zones which may be independently controlled to increase, decrease or hold the heat intensity delivered to specific locations in the reaction chamber 14. Preferably, the lamps positioned in each concentric circle are grouped into one control zone, resulting in four independently controllable zones.

To maintain chamber vacuum in the reaction chamber 14, a quartz window 30 is situated between the heating lamps 20-25 and the wafer 16. The RTP reactor 12 may include other apparatus and mechanism related to the semiconductor process, such as gas showerheads, which are not described herein.

Multi-point wafer temperature sensing apparatus 32 involves a pyrometry technology using a predetermined number of infrared optical fiber probes 34-37 installed with the measurement end of each fiber probe 34-37 exposed to the radiant heat of the heat lamps 20-25, the quartz window 30, and the wafer 16. The multi-point wafer temperature sensing apparatus 32 preferably operates at approximately 3.3 $\mu$m in order to bypass the radiance emitted from the heating lamps 20-25 and focus on the radiant heat of the wafer 16. The fiber probes 34-37 are arranged over the wafer 16 in a manner to detect the wafer temperature at various points of the wafer 16 from its center to its outer edge. The arrangement shown in FIG. 1 is approximate and only serves to illustrate the positions of the fiber probes 34-37.

The wafer temperature sensing apparatus 32 obtains wafer pyrometer readings, $V_{Pn}$, where n=1, 2, 3 and 4, corresponding to the radiance intensity at four wafer locations, and a conversion database or table 46 is used to convert the pyrometer voltage readings $V_{Pn}$ to corresponding temperature levels $T_{Pn}$. The pyrometer voltage reading to temperature conversion is described in more detail below. The wafer temperature measurement $T_{Pn}$ or $V_{Pn}$ may have been further processed to increase the accuracy thereof. For a detailed description of an example of the multi-point wafer temperature sensing apparatus 32, please refer to U.S. Pat. No. 5,156,461, issued on Oct. 20, 1992 to Moslehi et al.

Figure 2:
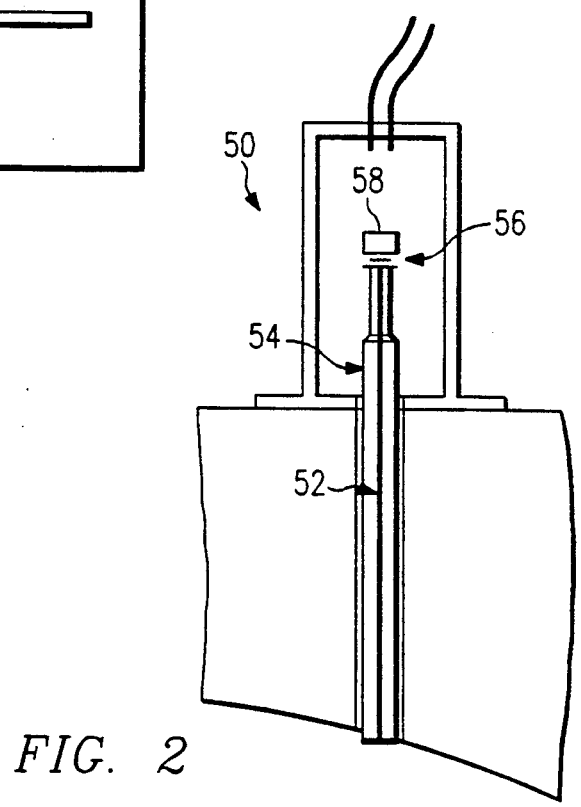
FIG. 2 is a simplified cross-sectional diagram of a preferred embodiment of the window pyrometer assembly.

In addition to the multi-point wafer temperature sensing apparatus 32, a window temperature pyrometric apparatus or window pyrometer 50 is provided to measure the quartz window temperature. Referring also to FIG. 2, the window pyrometer 50 includes an infrared pyrometer preferably operating at approximately 5.4 $\mu$m. In general, wavelengths above 5.0 $\mu$m are adequate for this purpose. A chalcogenide fiber-optic bundle is preferably used as the fiber optic probe 52 to optimize its operation in the 5.4 $\mu$m wavelength range. The operating wavelength of 5.4 $\mu$m is used so that quartz window 30 is opaque to the window temperature pyrometer 50, and that wafer radiance is not a contributing factor. Furthermore, the relatively long wavelength of 5.4 $\mu$m ensures that adequate signal level is received from the window 30, which is at approximately 200 to 600 degrees Celsius during normal RTP operation.

The chalcogenide fiber bundle 52 is preferably held in a lightpipe assembly 54 which helps to cool it. The optical fiber bundle 52 and the lightpipe assembly 54 may be obtained from Galileo Electro Optics Corp. of Concord, Mass. Window pyrometer 50 further includes a narrow bandpass filter 56 preferably passing infrared light at 5.4 $\mu$m, and an infrared detector 58, such as those manufactured by Williamson Corp. of Concord, Mass. The resulting signal is a window pyrometer voltage reading, $V_W$, corresponding to the radiance intensity emitted by the window 30.

The converted wafer temperatures $T_{Pn}$ and the window pyrometer reading $V_W$, are provided to a window temperature compensation module 70, which modifies the wafer temperature measurements $T_{Pn}$ to compensate the inaccuracies caused by the window temperature. A lamp controller module 80 generates heat lamp multizone control signals, as indicated by signals $P_n$, where n=1, 2, 3 and 4, which modify the intensities of the heat lamps 20-25 in respective zones.

Figure 3:
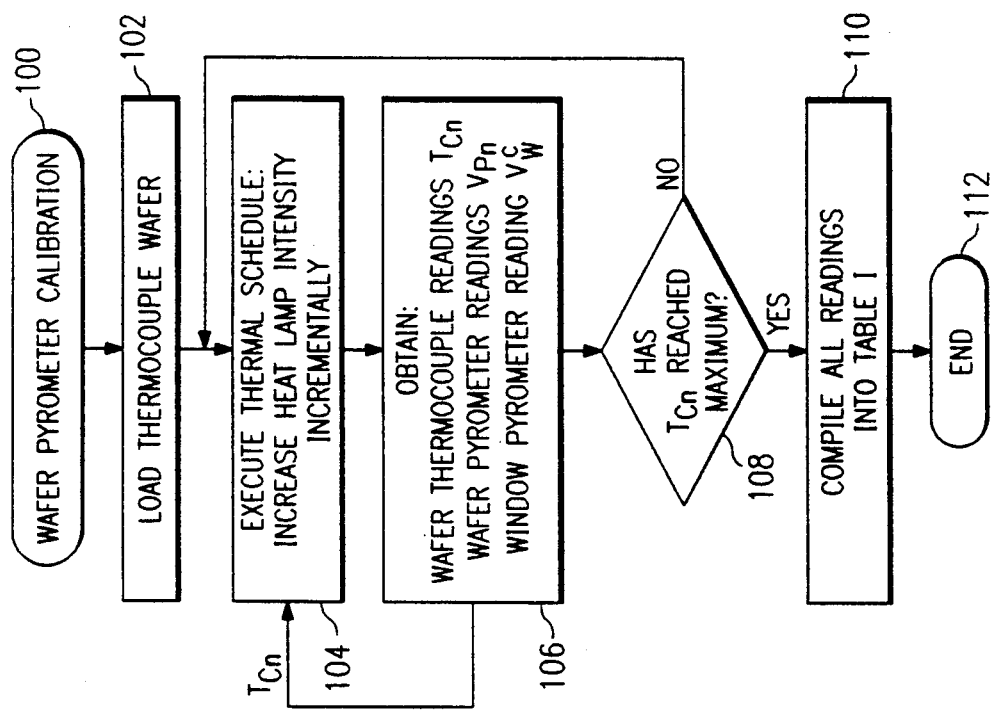
FIG. 3 is a flowchart of a preferred embodiment of the wafer pyrometer calibration process.

Referring to FIG. 3, a flow chart for the wafer pyrometer calibration process 100 is shown. Calibration is done by using a bonded thermocouple wafer (not shown), which provides accurate wafer temperature at several selected locations of the wafer corresponding to the various heating lamp zones. Preferably, the temperature of the thermocouple wafer is sensed at four locations along a radial line of the wafer. As shown in block 102, the thermocouple wafer is loaded into the RTP reactor chamber 14. The initial condition of the system 12 is at warm idle, which is similar to the start up condition for typical wafer processing in the RTP reactor 12. The RTP reactor 12 then executes a thermal schedule which increases the wafer temperature in predetermined small incremental steps, as shown in block 104. As shown in block 106, the wafer pyrometer 32 and window pyrometer 50 operate to obtain wafer pyrometer temperature readings $V_{Pn}$, where n=1, 2, 3 and 4, and window pyrometer readings, $V_W{}^c$, along with the thermocouple wafer temperature readings, $T_{cn}$, where n=1, 2, 3 and 4. The increase in temperature and data gathering process is repeated until the thermocouple wafer temperature $T_{cn}$ reaches a predetermined maximum as determined in block 110. This process thus provides wafer pyrometer calibration for a wide range of processing temperatures. The range of wafer temperatures represents the possible temperatures that will be executed by the RTP reactor 12 in wafer processing. Therefore, if a RTP reactor is known to operate only at one or a small number of temperature settings, the wafer pyrometer calibration process may be tailored to calibrate only at those temperatures. All of the temperature readings obtained in block 106 are then compiled into a TABLE I having the following format, for example:

TABLE I

| $V_{Pn}$ | $T_{Pn}$ | $V_W{}^c$ |
|---|---|---|
| . | . | . |
| . | . | . |
| 1.0 V | 500° C. | 0.5 V |
| . | . | . |
| . | . | . |
| 2.0 V | 800° C. | 1.5 V |
| . | . | . |
| . | . | . |

Therefore, for each wafer pyrometer reading $V_{Pn}$, where n = 1, 2, 3, or 4, a corresponding wafer temperature, $T_{Pn}$, and window pyrometer reading, $V_W{}^c$, are provided. By accessing TABLE I using $V_{Pn}$, the corresponding $T_{Pn}$ and $V_W{}^c$ readings become available. When TABLE I is compiled, the wafer pyrometer calibration process 100 is complete, as shown in block 112.

Note that since the wafer temperature is detected at four locations resulting in four sets of wafer pyrometer and thermocouple readings, each wafer location is associated with its own TABLE I. Therefore, four such tables are generated, one for each wafer location, by the wafer pyrometer calibration process 100. Since the wafer pyrometer calibration process 100 is performed for the entire range of operating temperatures for the RTP reactor 12, this calibration process generally need only be repeated when physical components of the reactor 12 or the pyrometers 32 and 50 are modified or altered in some manner.

Figure 4:
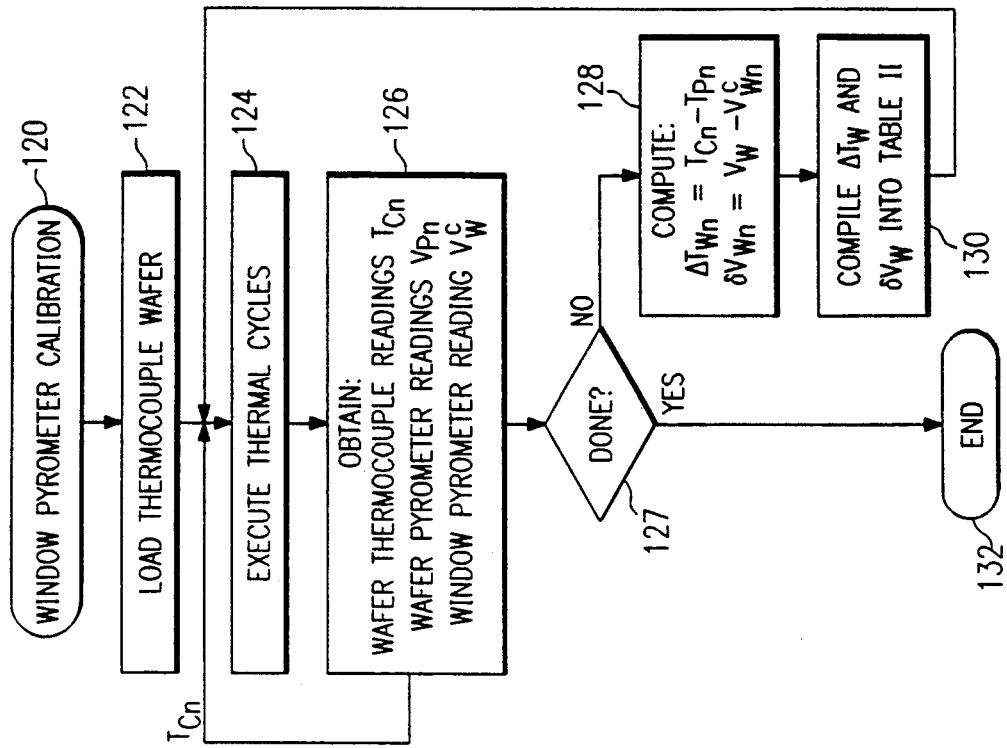
FIG. 4 is a flowchart of a preferred embodiment of the window pyrometer calibration process.

Referring to FIG. 4, a flowchart showing a preferred window pyrometer calibration process 120 is shown. This calibration process 120 also uses a thermocouple wafer (not shown), which is loaded into the reactor chamber 14. As shown in block 124, the RTP reactor 12 then executes a number of thermal cycles having thermal sequences similar to those executed in a typical wafer fabrication process in the RTP 12. Preferably, at least five such thermal cycles are executed during which the wafer thermocouple readings, $T_{cn}$, the wafer pyrometer readings, $V_{Pn}$, and window pyrometer readings, $V_W$, where n = 1, 2, 3 and 4, are obtained, as shown in block 126.

Figure 5:
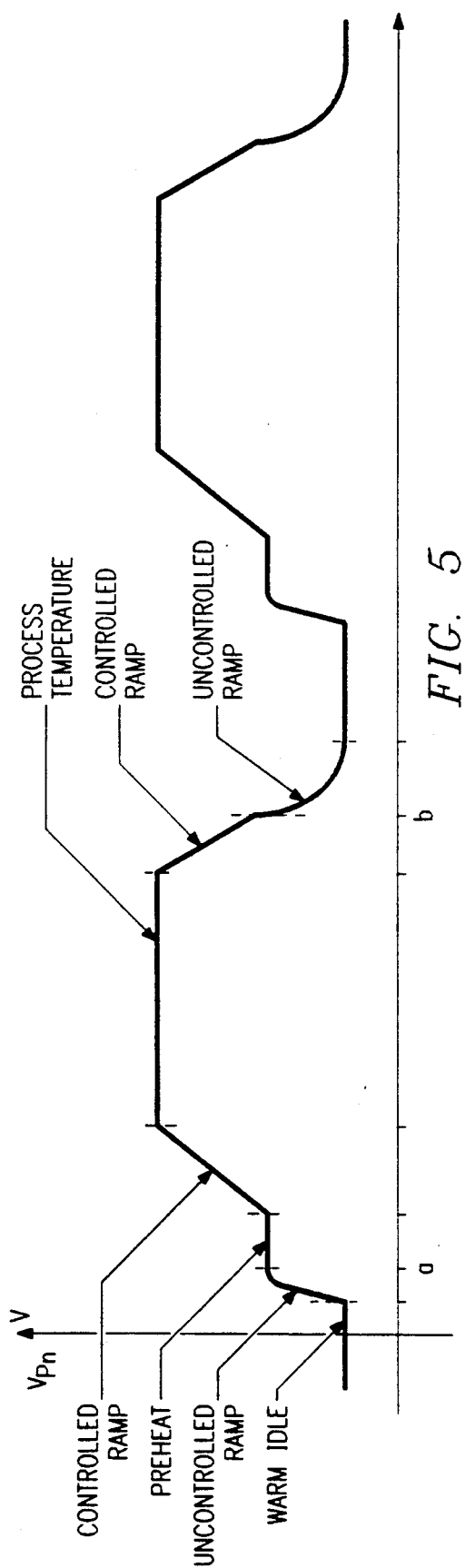
FIG. 5 is a plot of wafer pyrometer reading $V_{Pn}$ versus time during a typical wafer processing thermal schedule.
Figure 6:
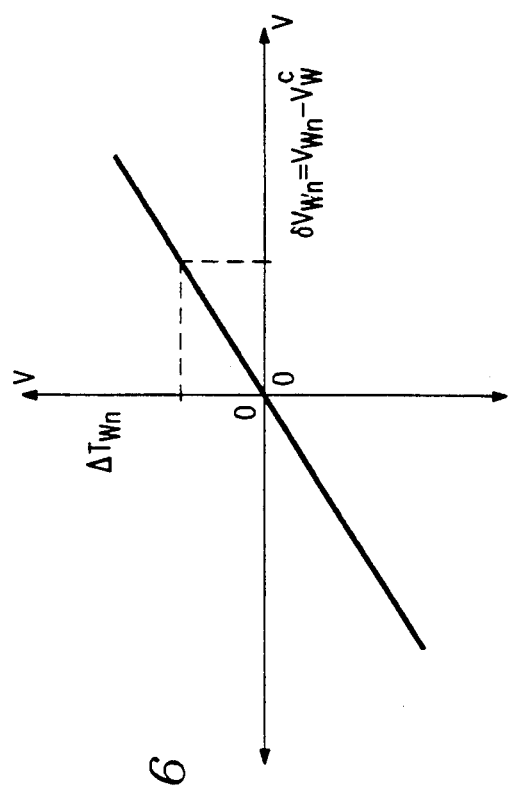
FIG. 6 is an exemplary plot of window temperature error, $\Delta T_W$, versus window pyrometer voltage offset, $\delta V_w$.

During the thermal cycles, the wafer temperatures experience rises and falls similar to those shown in FIG. 5. The wafer temperature in a typical wafer processing thermal cycle goes from a minimum at warm idle to a rapid increase in wafer temperature (uncontrolled ramp) to a point where a preheat portion of the thermal sequence is executed. The wafer temperature then increases steadily in a controlled ramp, which ultimately plateaus at a process temperature. The process temperature is held for a predetermined duration, and then the heat is gradually decreased in a controlled ramp to a point b, where the wafer temperature further decreases during an uncontrolled ramp to warm idle. Multiple or at least five thermal cycles are executed during the window pyrometer calibration process, so that the quartz window temperature reaches a stationary state during the calibration process 120. This enhances the accuracy of the data collected during the window pyrometer calibration process 120. As indicated in FIG. 4, multiple wafer thermocouple readings, $T_{cn}$, wafer pyrometer readings, $V_{Pn}$, and window pyrometer readings, $V_W$, are continuously gathered between the time interval marked by points a and b during each thermal cycle.

As the wafer thermocouple readings, $T_{cn}$, are collected, they are provided to lamp controller module 80 (FIG. 1) to generate signals to increase or decrease the lamp intensity in each respective zone according to the predetermined thermal cycle heating sequence. In block 127, a determination is made as to whether the desired thermal cycles have been completely executed according to $T_{cn}$ and the number of thermal cycles that have been executed. If the calibration process is not yet done, execution proceeds to block 128.

In block 128, a window temperature error factor $\delta T_{Wn}$ is computed by subtracting $T_{Pn}$ from $T_{cn}$. $T_{cn}$ is the thermocouple wafer temperature reading gathered currently during the window pyrometer calibration process 120, and $T_{Pn}$ is the thermocouple wafer temperature reading obtained during the wafer calibration process 100 (FIG. 3), which is accessed by indexing the currently obtained wafer pyrometer reading, $V_{Pn}$, in TABLE I. Therefore, the window temperature error is defined by:

$$\Delta T_{Wn} T_{cn} - T_{Pn}, \quad (1)$$

where n = 1, 2, 3, or 4. The window pyrometer voltage offset $\delta V_W$ is defined by:

$$\delta V_{Wn} = V_W - V_{Wn}{}^c, \quad (2)$$

where n = 1, 2, 3, or 4. Note that $V_W$ is the window pyrometer reading gathered currently during the window pyrometer calibration process 120, and $V_{Wn}{}^c$ is made available by indexing TABLE I with $V_{Pn}$ to access the window pyrometer reading gathered during the wafer pyrometer calibration process 100 (FIG. 3). Subsequent to the $\Delta T_{Wn}$ and $\delta V_{Wn}$ computation step 128, the $\Delta T_{Wn}$ and the corresponding $\delta V_{Wn}$ values are compiled into a window pyrometer calibration table (not shown) containing window temperature error factors and corresponding window pyrometer voltage offsets. So that indexing the table by window temperature error, $\Delta T_{Wn}$ yields the corresponding window pyrometer voltage offset, $\delta V_{Wn}$, as shown in block 130.

The window pyrometer calibration table may be generated for each wafer process schedule having unique heating characteristics, i.e., specified ramp rates, preheat and process temperatures, however, repeated window pyrometer calibration 120 may not be necessary as the resulting window pyrometer calibration table may be negligibly dissimilar between the different wafer processes. FIG. 8 illustrates a possible plot of $\Delta T_{Wn}$ versus $\Delta V_{Wn}$. The linearity of $\Delta T_{Wn}$ and $V_{Wn}$ may be achieved by smoothing or averaging techniques, such as assigning data to bins, and averaging data within the same bin. Note further that one window pyrometer calibration table is provided for each temperature sensing location on the thermocouple wafer. The thermal execution and data gathering process is repeated until the desired thermal cycles have been executed, and the calibration process 120 ends in block 132.

Figure 7:
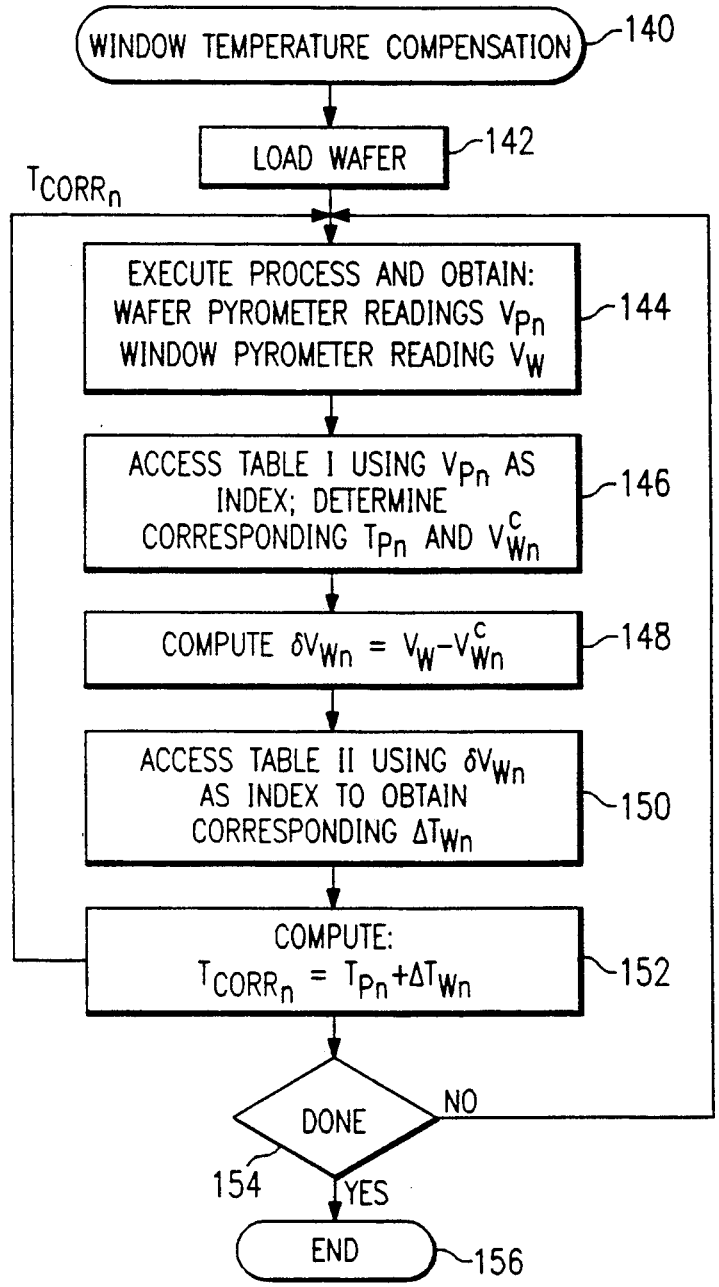
FIG. 7 is a flowchart of a preferred embodiment of the wafer temperature compensation function.

Referring to FIG. 7, the window temperature compensation function 140 performed by window temperature compensation module 70 (FIG. 1) during regular RTP wafer processing is shown. During regular operation, the wafer pyrometer calibration table, TABLE I, and the window pyrometer calibration table are used to provide the necessary correction to the wafer pyrometer temperature reading due to window heating. After the wafer to be processed in the RTP reactor 12 is loaded into the chamber 14, as shown in block 142, the RTP reactor 12 is ready to begin executing the process recipe which describes the heating sequence. During heating process execution, as shown in block 144, wafer pyrometer readings $V_{Pn}$ and window pyrometer reading $V_W$ are collected. Similar to the window calibration process 120, the data are gathered during the time interval between and including preheat and controlled ramp (down), as shown in FIG. 5, or some equivalent time interval during the heating process.

As shown in block 146, using the wafer pyrometer readings $V_{Pn}$ collected as an index, TABLE I is accessed to find the corresponding wafer pyrometer temperature $T_{Pn}$ and window pyrometer voltage reading $V_{Wn}{}^c$ obtained during the wafer calibration process 100 (FIG. 3). Therefore, the window pyrometer voltage offset $\Delta V_{Wn}$ can be computed by using the presently obtained $V_W$ and the $V_{Wn}{}^c$ value from TABLE I, and using Equation (2), as shown in block 148. Thereafter, the computed window pyrometer voltage offset $\Delta V_{Wn}$ is used as an index into the window pyrometer calibration table to obtain the corresponding window temperature error $\Delta T_{Wn}$, as shown in block 150. Since the values of $\Delta T_{Wn}$ and $\delta V_{Wn}$ in the window pyrometer calibration table may display some non-linearity, it may be necessary to use higher order interpolation to extract useful data from it. For example, an interpolation algorithm such as cubic splines may do so adequately. Implemented in this manner, the resultant $\Delta T_{Wn}$ values do not have sudden jumps in the rate of change and avoid possible swings in the control of the heating lamps 20-25 during wafer processing.

To compute the corrected wafer temperature $T_{CORRn}$, where n = 1, 2, 3, and 4 representing the four locations on the wafer, the following equation is used, as shown in block 152:

$$T_{CORRn} = T_{Pn} + \Delta T_{Wn}, \quad (3)$$

where $T_{Pn}$ is the value obtained from TABLE I using the currently obtained wafer pyrometer reading $V_{Pn}$ as an index (block 146), and $\Delta T_{Wn}$ is the value obtained from the window pyrometer calibration table using $\Delta V_{Wn}$ as the index (block 150). Therefore, $T_{CORRn}$ represents the corrected wafer temperatures that have been compensated for inaccuracies caused by the temperature of the quartz window 30 (FIG. 1).

The corrected wafer temperatures $T_{COORn}$ is then examined to determine whether the wafer heating process has been completed, as shown in block 154. If the values of $T_{CORRn}$ indicate that the process is not done, execution returns to block 144, where the process is repeated. For emphasis, $T_{COORn}$ is shown made available to block 144, indicating that the heating lamp controller 80 (FIG. 1) makes use of the corrected wafer temperatures to generate the multi-zone control signals $P_n$ to increase, decrease or maintain the intensities of the heating lamps 20-25 (FIG. 1). On the other hand, if the corrected wafer temperatures $T_{COORn}$ indicate that the wafer heating process has been completed, the execution terminates in block 156.

Implemented in this manner, the pyrometer wafer temperature measurements can be corrected with the temperature reading of the quartz window in a RTP reactor. The wafer pyrometer measurements performed in any RTP reactor equipped with a quartz window in view of a pyrometer access port can be made more accurate in this manner. Although not described in detail herein, the instant may take advantage of window temperatures obtained by some other means, such as with a thermocouple. In addition, although not described herein, the wafer temperature reading may be pre-processed prior to the window temperature compensation, and the window-temperature-compensated-wafer temperatures may be subjected to additional signal processing to further increase the accuracy thereof.

Although the present invention has been described in detail, it should be understood that various changes, substitutions and alterations can be made thereto without departing from the spirit and scope of the present invention as defined by the appended claims.

What is claimed is:

1. A method for controlling a RTP reactor, the RTP reactor having at least one heating element heating and processing a wafer through a window, and a wafer pyrometer assembly adapted for measuring the wafer temperature through the window and producing wafer pyrometer measurements, the method comprising the steps of:

mounting a window temperature sensor in said RTP reactor adapted for measuring the window temperature and producing window temperatures;

calibrating the wafer pyrometer assembly and producing wafer calibration data using a thermocouple wafer;

compiling a calibration table having wafer calibration data including window temperature error factors;

executing a predetermined wafer processing heating sequence for wafer processing;

collecting wafer pyrometer measurements and window temperatures;

computing a corrected wafer temperature by accessing data stored in said wafer pyrometer calibration table; and controlling said heating element in response to said computed corrected wafer temperature.

2. The method, as set forth in claim 1, said heating element including a plurality of heating lamps divided into n control zones, and said wafer pyrometer assembly being adapted for producing n wafer pyrometer measurements from n wafer locations associated with intensities of said heating lamps in said respective n control zones, wherein said wafer pyrometer calibration step, said wafer pyrometer calibration table compiling step, and said corrected wafer temperature computing step perform said respective tasks in response to said n wafer pyrometer measurements.

3. The method, as set forth in claim 2, wherein said corrected wafer temperature computing step includes the step of computing n corrected wafer temperatures corresponding to the temperature at said n wafer locations, and said heating lamp controlling step includes the step of controlling said heating lamps in said n control zones in response to said respective n corrected wafer temperatures.

4. The method, as set forth in claim 1, wherein said window temperature sensor is a window pyrometer, and said window temperature sensor mounting step further includes the steps of:
- mounting an optical fiber bundle in said RTP reactor generally aimed at said window, said optical fiber bundle receiving radiance emitted from said window;
- filtering said received emitted radiance to pass radiance of a predetermined narrow range of wavelengths; and
- detecting said filtered radiance and producing a window pyrometer measurement.

5. The method, as set forth in claim 4, wherein said wafer pyrometer calibrating step further includes the step of producing first wafer pyrometer measurements, first true wafer temperatures, and first window pyrometer measurements for a predetermined range of first true wafer temperature measurements.

6. The method, as set forth in claim 5, wherein said calibration table compiling step includes the step of compiling a wafer pyrometer calibration table indexable by said first wafer pyrometer measurements to access corresponding said first true wafer temperatures, and window pyrometer measurements.

7. The method, as set forth in claim 6, wherein said calibration table compiling step further comprises the steps of:
- calibrating the window pyrometer assembly and producing second wafer pyrometer measurements, second true wafer temperatures, and second window pyrometer measurements for a predetermined number of thermal cycles; and
- compiling a window pyrometer calibration table indexable by a window pyrometer offset to access a corresponding window temperature error factor, said window temperature error factors being computed by subtracting said first true wafer temperature measurements from said second true wafer temperature measurements, and said window pyrometer offsets being computed by subtracting said first window pyrometer measurements from said second window pyrometer measurements.

8. The method, as set forth in claim 6, wherein said corrected wafer temperature computing step includes the steps of:
- using said collected second wafer pyrometer measurement as an index, accessing said wafer pyrometer calibration table to obtain said corresponding first window pyrometer measurement and said first true wafer temperature measurement;
- subtracting said first window pyrometer measurement from said second window pyrometer measurement to compute said window pyrometer offset;
- using said computed window pyrometer offset as an index, accessing said window pyrometer calibration table to obtain said corresponding window temperature error factor; and
- summing said first true wafer temperature measurement and said window temperature error factor to compute said corrected wafer temperature.

9. The method, as set forth in claim 1, wherein said calibration step includes the step of loading a thermocouple wafer into said RTP reactor.

10. The method, as set forth in claim 7, wherein said window pyrometer calibration step includes the step of loading a thermocouple wafer into said RTP reactor.

11. A method for controlling a RTP reactor in processing a semiconductor wafer, the RTP reactor having at least one heating element heating the wafer through a window, and a wafer pyrometer assembly adapted for measuring the wafer temperature through the window and producing wafer pyrometer measurements, the method comprising the steps of:
- mounting a window pyrometer assembly in said RTP reactor adapted for measuring the window temperature and producing window pyrometer measurements;
- loading a thermocouple wafer in said RTP reactor, said thermocouple wafer being adapted for producing true wafer temperatures;
- calibrating the wafer pyrometer assembly and producing first wafer pyrometer measurements, first true wafer temperatures, and first window pyrometer measurements for a predetermined range of first true wafer temperature measurements;
- compiling a wafer pyrometer calibration table indexable by said first wafer pyrometer measurements to access corresponding said first true wafer temperatures, and window pyrometer measurements;
- calibrating the window pyrometer assembly and producing second wafer pyrometer measurements, second true wafer temperatures, and second window pyrometer measurements for a predetermined number of thermal cycles;
- compiling a window pyrometer calibration table indexable by a window pyrometer offset to access a corresponding window temperature error factor, said window temperature error factors and window pyrometer offsets being computed from said second true wafer temperatures, second window pyrometer measurements, and by accessing said wafer pyrometer calibration table;
- removing said thermocouple wafer and loading a wafer for processing;
- executing a predetermined wafer processing heating sequence;
- collecting wafer pyrometer measurements and window pyrometer measurements;
- computing a corrected wafer temperature by accessing data stored in said wafer pyrometer calibration table and said window pyrometer calibration table; and
- controlling said heating element in response to said computed corrected wafer temperature.

12. The method, as set forth in claim 11, wherein said window pyrometer table compiling step further includes the step of subtracting said first true wafer temperature measurements from said second true wafer temperature measurements to compute said window temperature error factors.

13. The method, as set forth in claim 11, wherein said window pyrometer table compiling step further includes the step of subtracting said first window pyrometer measurements from said second window pyrometer measurements to compute said window pyrometer offsets.

14. The method, as set forth in claim 11, wherein said window pyrometer mounting step further includes the steps of:
- mounting an optical fiber bundle in said RTP reactor generally aimed at said window, said optical fiber bundle receiving radiance emitted from said window;

filtering said received emitted radiance to pass radiance greater than 5.0 μm; and detecting said filtered radiance and producing said window pyrometer measurement.

15. The method, as set forth in claim 11, wherein said corrected wafer temperature computing step includes the steps of:

using said collected second wafer pyrometer measurement as an index, accessing said wafer pyrometer calibration table to obtain said corresponding first window pyrometer measurement and said first true wafer temperature measurement;

subtracting said first window pyrometer measurement from said second window pyrometer measurement to compute said window pyrometer offset;

using said computed window pyrometer offset as an index, accessing said window pyrometer calibration table to obtain said corresponding window temperature error factor; and summing said first wafer pyrometer measurement and said window temperature error factor.

16. The method, as set forth in claim 11, said heating element including a plurality of heating lamps divided into n control zones, and said wafer pyrometer assembly being adapted for producing n wafer pyrometer measurements from n wafer locations associated with intensities of said heating lamps in said respective n control zones, wherein said wafer and window pyrometer calibration steps, said wafer and window pyrometer calibration table compiling steps, and said corrected wafer temperature computing step perform said respective tasks in response to said n wafer pyrometer measurements.

17. The method, as set forth in claim 16, wherein said corrected wafer temperature computing step includes the step of computing n corrected wafer temperatures corresponding to the temperature at said n wafer locations, and said heating lamp controlling step includes the step of controlling said heating lamps in said n control zones in response to said respective n corrected wafer temperatures.

18. Apparatus for controlling a RTP reactor, the RTP reactor having at least one heating element controllably heating a wafer through a window, and a wafer pyrometer assembly producing at least one wafer pyrometer measurement, comprising:

a window pyrometer assembly mounted in the RTP reactor adapted for measuring the temperature of the window and producing a window pyrometer measurement;

a window temperature compensation module receiving said wafer and window pyrometer measurements during wafer processing, said window temperature compensation module computing a corrected wafer temperature in response thereto; and a heating element controller receiving said computed corrected wafer temperature and generating heating lamp control signals in response thereto for controlling said heating element.

19. The apparatus, as set forth in claim 18, said heating element including a plurality of heating lamps divided into n control zones, said wafer pyrometer assembly being adapted for producing n wafer pyrometer measurements from n wafer locations associated with said heating lamps in said respective n control zones, wherein said window temperature compensation module computes n corrected wafer temperatures, and said heating element controller generates respective heating lamp control signals in response to said n corrected wafer temperatures.

20. The apparatus, as set forth in claim 18, wherein said window pyrometer assembly further comprises:

an optical fiber bundle mounted in said RTP reactor and generally aimed at said window, said optical fiber bundle receiving radiance emitted from said window;

a narrow bandpass filter receiving said emitted radiance and passing radiance of a predetermined narrow range of wavelengths; and a detector coupled to said narrow bandpass filter detecting said filtered radiance and producing said window pyrometer measurement.

21. The apparatus, as set forth in claim 18, further comprising:

a wafer pyrometer calibration table indexable by said wafer pyrometer measurements to access corresponding window pyrometer measurements, and corresponding true wafer temperatures; and a window pyrometer calibration table indexable by a window pyrometer offset to access a corresponding window temperature error factor, said window temperature error factors and window pyrometer offsets being computed from said true wafer temperatures, window pyrometer measurements, and by accessing said wafer pyrometer calibration table.

22. A method for controlling the temperature of at least one wafer being processed in a reactor chamber, the temperature of the wafer being modified by a heating system, the heating system being separated from the wafer by a window, the method comprising the steps of:

executing a prescribed wafer temperature schedule for processing the wafer;

remotely measuring the temperature of the wafer;

measuring the temperature of the window;

computing a corrected wafer temperature by using the measured wafer and window temperatures, and accessing a temperature calibration table; and controlling the hating system in response to the computed corrected wafer temperature and the prescribed wafer temperature schedule.

23. The method, as set forth in claim 22, further comprising the steps of:

calibrating a first sensor used for remotely measuring the wafer temperature and producing at least one wafer measurement data;

compiling said wafer measurement data into a wafer calibration table;

calibrating a second sensor used for measuring the window temperature and producing at least one window measurement data;

accessing wafer measurement data in said wafer calibration table and compiling with said window measurement data into a window calibration table; and said corrected wafer temperature computing step further accessing said window calibration table.

* * * * *